United States Patent [19]
Finn et al.

[11] Patent Number: 5,843,234
[45] Date of Patent: Dec. 1, 1998

[54] METHOD AND APPARATUS FOR AIMING A BARREL REACTOR NOZZLE

[75] Inventors: Donald Finn, Chesterfield; Lance G. Hellwig, Jennings, both of Mo.

[73] Assignee: MEMC Electronic Materials, Inc., St. Peters, Mo.

[21] Appl. No.: 644,181

[22] Filed: May 10, 1996

[51] Int. Cl.$^6$ .................................................. C23C 16/00
[52] U.S. Cl. ........................... 118/715; 118/715; 118/730
[58] Field of Search ..................................... 118/715, 730; 427/248.1

[56] References Cited

U.S. PATENT DOCUMENTS 4,928,626  5/1990  Carlson et al. ........................ 118/715

OTHER PUBLICATIONS

AMC–7810/11 and AMC–7820/21 Cylindrical Epitaxial Reactors System Manual; Applied Materials; 1982, pp. 1–12, 1–13.
Patent Abstract of Japan, vol. 016, No. 394 (C–0976), 21 Aug. 1992, Abstract of JP 04 130085 A (Sumitomo Electric Ind Ltd) 1 May 1992.
Patent Abstract of Japan, vol. 010, No. 078 (C–335), 27 Mar. 1986, Abstract of JP 60 215594 A (Fuijitsu KK) 28 Oct. 1985.

Primary Examiner—Richard Bueker
Attorney, Agent, or Firm—Senniger, Powers, Leavitt & Roedel

[57] ABSTRACT

A jet assembly for delivering reactant gas from a reactant gas supply to a barrel reactor reaction chamber during a chemical vapor deposition process. The jet assembly comprises a nozzle and a positioning device. The nozzle is adapted for mounting on the barrel reactor in fluid communication with the supply of reactant gas for selectively delivering a jet of reactant gas from the supply to the reaction chamber. The nozzle is pivotable relative to the barrel reactor for selectively altering the direction in which the reactant gas jet enters the reaction chamber. The positioning device is connected to the nozzle for pivoting the nozzle relative to the barrel reactor to alter the direction in which the reactant gas jet enters the reaction chamber. The positioning device is constructed to permit quantitative measurement of the position of the nozzle relative to the barrel reactor thereby permitting reproducible aiming of the nozzle for selecting the direction in which the reactant gas jet enters the reaction chamber.

17 Claims, 4 Drawing Sheets

FIG. 1

METHOD AND APPARATUS FOR AIMING A BARREL REACTOR NOZZLE

BACKGROUND OF THE INVENTION

This invention relates generally to chemical vapor deposition of material on semiconductor wafers, and more particularly to a method and apparatus for accurately determining and adjusting the orientation of barrel reactor nozzles to improve the thickness uniformity of the material deposited on the semiconductor wafers.

Chemical vapor deposition is a process for growing a thin layer of material on a semiconductor wafer so that the lattice structure is identical to that of the wafer. Using this process, a layer having different conductivity may be applied to the semiconductor wafer to achieve the necessary electrical properties. Chemical vapor deposition is widely used in semiconductor wafer production to build up epitaxial layers on the wafer surfaces to achieve the necessary electrical properties of the wafers. For example, a lightly doped epitaxial layer deposited over a heavily doped substrate permits a CMOS device to be optimized for latch up immunity as a result of the low resistance of the substrate. Other advantages, such as precise control of the dopant concentration profile and freedom from oxygen are also achieved.

Chemical vapor deposition is performed in various types of reactors in which reactant gas flows over the faces of the semiconductor wafers. Barrel reactors are the most common reactor type used in the semiconductor industry. Conventional barrel reactors have silicon carbide coated, graphite susceptors which are polygonal tubes having walls which taper slightly outward toward their bottoms. Circular recesses are vertically arranged along each susceptor wall for receiving semiconductor wafers. The susceptor is suspended and rotated in a reaction chamber and the reactant gas is introduced near the top of the chamber through two nozzles which direct generally horizontal jets of gas into the chamber. Jet assemblies hold and aim the nozzles so the jets collide with each other at a point positioned between the susceptor and an interior wall of the reaction chamber, ideally to eliminate the circumferential velocity components of the gas jets. The mixed gas jets flow generally downward over the exposed surfaces of the wafers held by the susceptor to the bottom of the reaction chamber.

One of the primary problems associated with chemical vapor deposition in barrel reactors is maintaining the inter-wafer and intra-wafer thickness uniformity of the deposited material. Thickness uniformity has become increasingly important as the line widths of integrated circuits are reduced. Narrow line widths of integrated circuits require very flat surfaces to accommodate the limited depth-of-field capability of optical lithography.

Among the parameters which affect thickness uniformity are the directions of the nozzles, the flow rate of gas through each nozzle, and the taper angle of the susceptors.

Generally speaking, adjustment of the nozzle directions affects the thickness uniformity in a vertical direction along the susceptor, and adjustment of the relative mass flow rates between the nozzles affects the thickness uniformity in the horizontal direction. In addition, minor changes in thickness uniformity can be made through temperature adjustments and altering the flow of purge gas through the susceptor.

In the past, verification and adjustment of the nozzle directions involved opening the barrel reactors, hanging a target grid in the reaction chamber where the gas jet from each nozzle should ideally be directed, and installing a tubular pointer over the end of the nozzle. When adjustment was necessary, the feed line from the reactant gas source to the jet assembly had to be disconnected and a lock nut within the assembly had to be loosened so that the nozzle could be moved without damaging it. When the nozzle was moved to the ideal position so that the pointer was aligned with the target, the lock nut was tightened and the feed line was reconnected.

Not only did the nozzle aiming procedure take time, but it also was a potential source of contamination. Generally speaking, chemical vapor deposition involves introduction of volatile reactants (e.g., $SiCl_4$, $SiHCl_3$, $SiH_2Cl_2$ or $SiH_4$) with a carrier gas (usually hydrogen) in a reactor. These reactants are highly reactive with oxygen, water vapor and organic compounds. Although every effort is made to avoid contamination, the prior procedure potentially caused contamination by dislodging silicon deposits during installation of the target and pointer and during the partial disassembly and reassembly of the jet assembly holding the nozzle.

Further, this procedure could be inaccurate due to the opportunity for the nozzle to move as the pointer was removed. Nozzle drift sometimes caused the nozzle to be farther out of alignment after an adjustment than before the adjustment, particularly when the adjustment was minor. In addition, the accuracy of the prior method of alignment was dependent on the fit between the pointer and the nozzle, as well as on the straightness of the pointer. However, due to the nature of the adjustment process, pointer fit and straightness were adversely affected over time, thereby reducing the accuracy of the adjustment process.

SUMMARY OF THE INVENTION

Among the several objects and features of the present invention is the provision of an apparatus for locating the nozzles of barrel reactors with increased accuracy to thereby increase the level of uniformity in intra-wafer and inter-wafer epitaxial thickness; the provision of such an apparatus which reduces the frequency of installing a target and pointer to verify the position of the nozzle; the provision of such an apparatus which eliminates the need to partially disassemble or loosen hardware in order to make nozzle adjustments; the provision of such an apparatus which reduces the potential for reaction chamber contamination; the provision of such an apparatus which enables the nozzle to be positioned without opening the barrel reactor; the provision of such an apparatus which exhibits highly repeatable nozzle positioning; the provision of such an apparatus which enables small and accurate nozzle position adjustments; and the provision of such an apparatus which enables nozzle repositioning in relation to present nozzle position.

Further among the several objects and features of the present invention may be noted the provision of a method for calibrating a graduated nozzle positioner so that highly repeatable and accurate results may be achieved.

Briefly, the jet assembly of the present invention comprises a nozzle and a positioning device. The nozzle is adapted for mounting on a barrel reactor in fluid communication with a supply of reactant gas for selectively delivering a jet of reactant gas from the supply to a reaction chamber. The nozzle is pivotable relative to the barrel reactor for selectively altering the direction in which the reactant gas jet enters the reaction chamber. The positioning device is connected to the nozzle for pivoting the nozzle relative to the barrel reactor to alter the direction in which the reactant gas jet enters the reaction chamber. The positioning device is constructed to permit quantitative measurement of the position of the nozzle relative to the barrel reactor thereby permitting reproducible aiming of the nozzle for selecting the direction in which the reactant gas jet enters the reaction chamber.

In another aspect, apparatus of the present invention comprises a nozzle, a connector, and a multi-axis stage. The nozzle is pivotable relative to a barrel reactor about first and second axes of rotation for selectively altering the direction in which a reactant gas jet enters a reaction chamber. The second axis is generally perpendicular to the first axis. The connector is connected to the nozzle and extends outwardly away from the reaction chamber for pivoting the nozzle relative to the barrel reactor in response to movement of the connector. The multi-axis stage is disposed outside the reaction chamber when the nozzle is mounted on the barrel reactor and includes first and second slider units. The first unit is connected to the connector and the second unit is connected to the barrel reactor. The first unit permits the connector to move relative to the barrel reactor in a first plane to pivot the nozzle about the second axis. The second unit permits the connector to move relative to the barrel reactor in a second plane to pivot the nozzle about the first axis.

In still another aspect, the present invention involves a method of optimally aiming a nozzle of a barrel reactor. The method comprises the steps of aiming the nozzle toward a first target site within the barrel reactor, pivoting the nozzle a predetermined amount to direct the nozzle toward a second target site spaced from the first target site, and measuring the distance between the first and second target sites thereby establishing a calibration factor correlating nozzle movement to a distance between current and desired reactant gas delivery sites.

Other objects and features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

Figure 1:
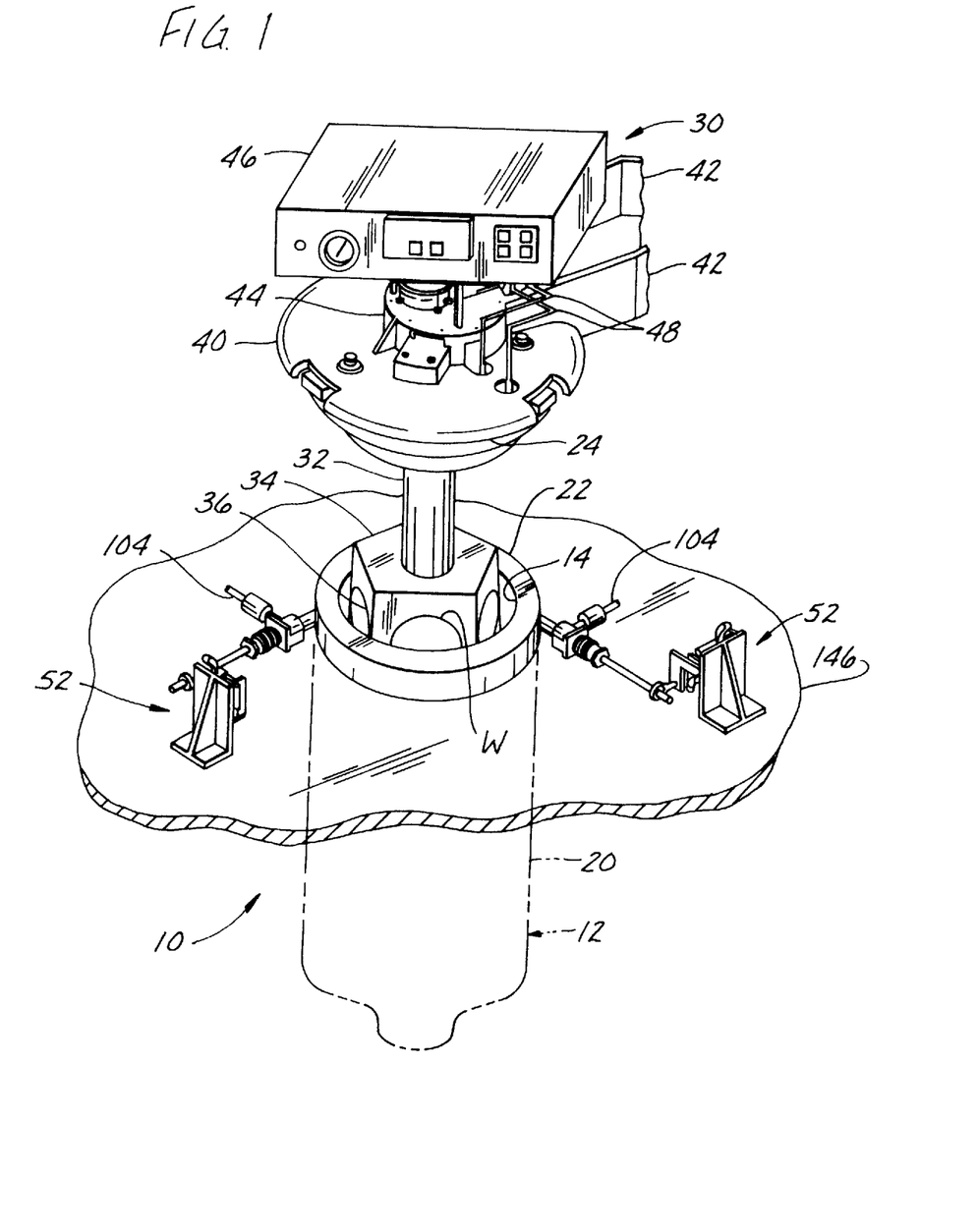
FIG. 1 is a fragmentary, schematic perspective of a barrel reactor.

Referring now to the drawings and in particular to FIG. 1, a barrel reactor, for use in chemical vapor deposition of a layer of semiconductor material on one face of wafers W, is indicated generally at 10. The barrel reactor includes a shell, generally designated by 12, defining a reaction chamber 14 in which the wafers W are positioned for chemical vapor deposition. The shell comprises an inverted quartz bell jar or reaction chamber vessel 20, a gas ring 22, and a seal plate 24.

A lift assembly, indicated generally at 30, is positioned generally above the reaction chamber 14 to raise and lower a quartz hanger 32 and a five-sided, silicon-coated, graphite susceptor 34 out of and into the bell jar 20. The susceptor 34 hangs from the hanger 32. The susceptor 34 has three, vertically arranged recesses 36 in each side wall which are sized to hold 150 millimeter (mm) semiconductor wafers W. The side walls of the susceptor 34 taper slightly outward toward the bottom so that the wafers W rest against the susceptor and are held in place by gravity. Further, this taper improves the uniformity of the epitaxial layer thicknesses by reducing the boundary layer effect as gas flows downward between the susceptor 34 and bell jar 20. It should be understood that the susceptor 34 may have different numbers of side walls and wafer recesses, and be constructed for processing wafers of different sizes without departing from the scope of the present invention.

A cap 40 supporting the seal plate 24 is positioned above the susceptor 34. Lift arms 42 connected to the cap 40 permit the cap to be raised and lowered to raise and lower the seal plate 24, hanger 32 and susceptor 34 with respect to the bell jar 20. A drive assembly 44 for rotating the hanger 32 and the susceptor 34 about their longitudinal axes, and a control 46 for controlling the drive assembly are located on top of the cap 40. Purge gas lines 48 connected through the cap 40 deliver purge gas to the seal plate 24 and drive assembly 44. The construction of the barrel reactor 10 as described above is well known to the semiconductor industry. Accordingly, only a general description its features and operation is given herein.

Figure 2:
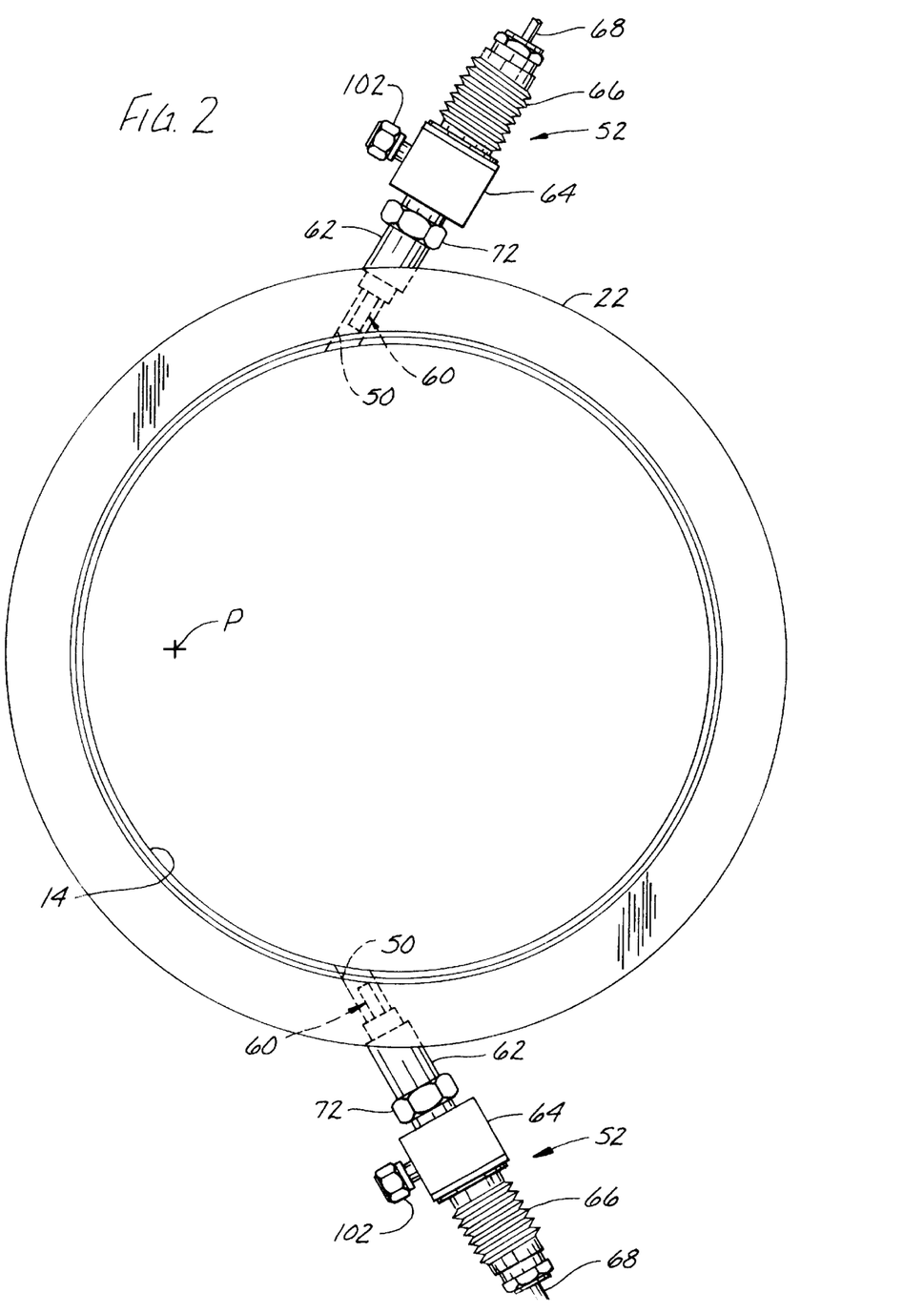
FIG. 2 is a top plan of a gas ring and gas injector jet assemblies.

As illustrated in FIG. 2, the gas ring 22 includes two jet port cavities 50 extending horizontally through the gas ring at opposite sides of the ring. Each of the cavities 50 extends through the gas ring 22 in a direction which is oblique with respect to radial. Further, the cavities 50 are oriented so that their centerlines intersect midway between the cavities at a point P circumferentially spaced from each of the cavities by approximately 90°. A gas injection jet assembly, generally designated by 52, is partially received in each of the jet port cavities 50. Reactant gas is delivered through these jet assemblies 52 to the reaction chamber 14 during the chemical vapor deposition process.

Figure 3:
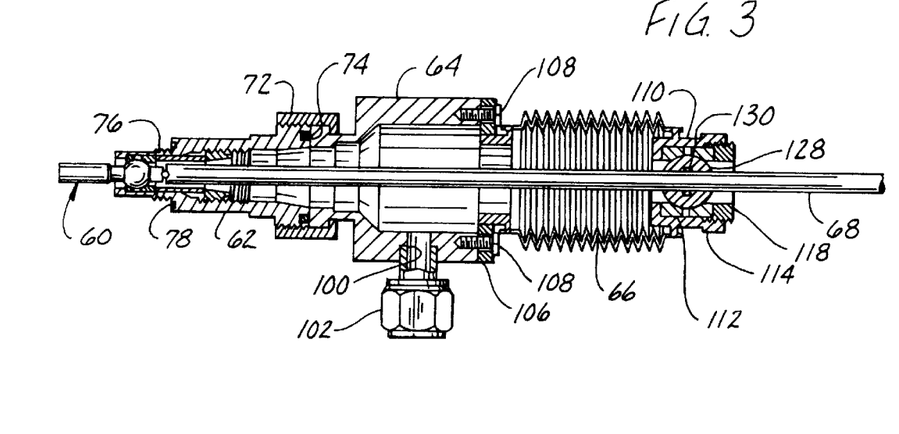
FIG. 3 is a fragmentary side elevation in partial section of a jet assembly and multi-axis stage.

FIG. 3 illustrates a gas injection jet assembly 52. A nozzle, generally indicated at 60, is positioned at the inner end (to the left as shown in FIG. 3) of the assembly 52. The nozzle 60 is held in an inner tubular body 62 which is fastened to an outer tubular body 64 having a flexible bellows 66 attached to its outboard end. Together, the inner and outer bodies 62, 64, and the bellows 66 form a nozzle housing assembly. A connector 68 in the form of a stem extends outwardly from the nozzle 60 to a positioning device, generally designated by 70. The connector 68 may be as long as a foot or more.

Figure 3A:
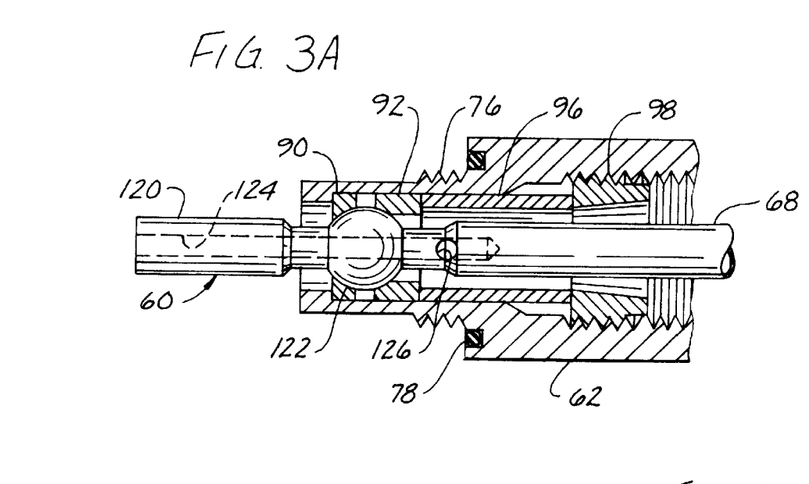
FIG. 3A is an enlarged fragmentary cross section of the inside end of the jet assembly of FIG. 3.

The inner and outer bodies 62, 64 are joined by a coupling nut 72. An O-ring 74 held in a groove in the inner body 62 seals the interface between the inner and outer bodies 62, 64. The inner body 62 has a threaded exterior portion 76 near its inner end for attaching the jet assembly 52 to mating threads within the jet port cavity 50 of the gas ring 22. A second O-ring 78 is trapped between the inner body 62 and the gas ring 22 for sealing the interface between the gas ring and the corresponding jet assembly 52. As best illustrated in FIG. 3A, opposing spherical bushings 90, 92 form a spherical bushing assembly disposed within the inner end of the inner body 62 for holding the nozzle 60. A spool 96 contacts the outside end of bushing 92 and a threaded retainer 98 screws into threads on the interior diameter of the inner body 62 to hold the bushing assembly and spool in place within the body.

Referring again to FIG. 3, the outer body 64 has a port 100 extending through its side which includes a fitting 102 for connection with a line 104 (FIG. 1) to supply the jet assembly 52 with reactant gas. The bellows 66 includes a flange 106 at its inner end for attaching the bellows to the outer body 64 with fasteners 108 and a cylindrical portion 110 at its outer end for holding a second bushing assembly having opposing spherical bushings 112, 114. A threaded retainer 118 screws into threads on the interior diameter of the bellows cylindrical portion 110 to hold the bushing assembly in place within the bellows 66.

The nozzle 60 has a tubular section 120 (FIG. 3A) which directs the reactant gas into the reaction chamber 14 as a jet. A spherical journal 122 is formed at the outer end of the tubular section 120 and is captured between the opposing spherical bushings 90, 92 in the inner body 62 thereby sealing the interface between the nozzle 60 and inner body and enabling the nozzle to pivot within the nozzle housing assembly. The connector stem 68 is integrally formed with the journal 122 opposite the tubular section 120. The stem 68 includes an internal passage 124 which extends from the stem through the journal 122 and tubular section 120. An orifice 126 extends vertically through the stem 68 and provides fluid communication between the interior of the nozzle housing and the internal passage 124 for directing reactant gas from the interior of the housing assembly to the tubular section 120 of the nozzle so that reactant gas may pass into the reaction chamber 14. Although other orientations are within the scope of this invention, it has been found that uniform epitaxial layer thicknesses are achieved when the orifices 126 of both jet assemblies 52 are similarly oriented with respect to each other. Preferably, the stems 68 of both jet assemblies 52 are oriented so that the centerline axes of the orifices 126 are vertical. The stem 68 is connected to the positioning device 70 for pivoting the nozzle relative to the barrel reactor 10 thereby altering the direction in which the reactant gas jet enters the reaction chamber 14. A spherical bearing 128 positioned within the second bushing assembly 110 slidably receives the connector 68. The bearing 128 is pivotable within the bushing assembly 110 so that it does not bind when the nozzle 60 pivots about spherical journal 122 within bushing assembly 90. An O-ring 130 between the stem and bearing 128 seals the interface between the two.

Figure 4:
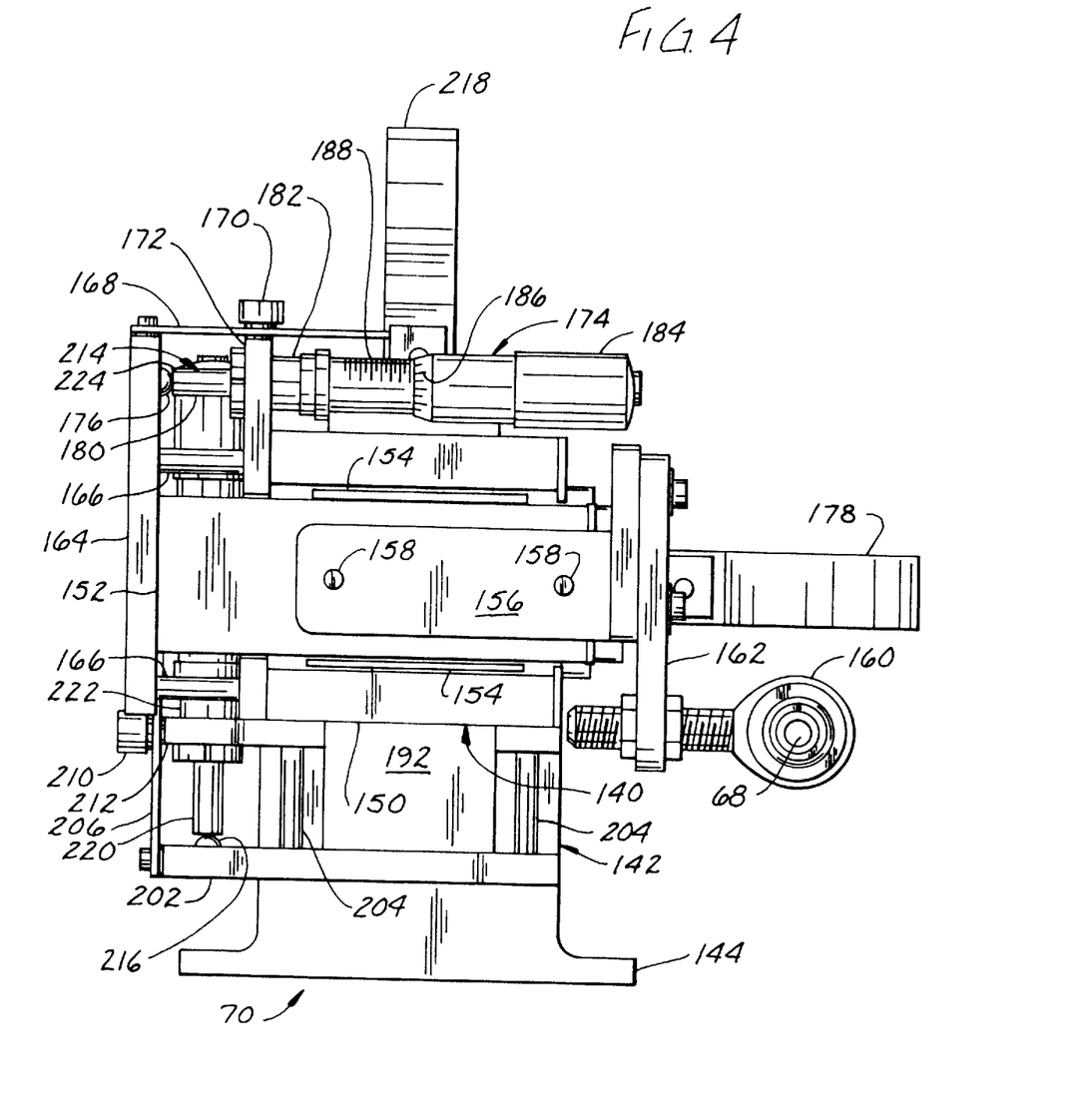
FIG. 4 is a rear elevation of the multi-axis stage.

Referring now to FIGS. 3 and 4, the positioning device comprises a multiple axis stage including a first slider unit 140 oriented for horizontal movement and a second slider unit 142 connected to the first unit and oriented for vertical movement. The connector 68 is attached to the first slider unit 140, and the second slider unit is connected to a base 144 which is attached to a table 146 (FIG. 1) surrounding the barrel reactor 10 so that the nozzle 60 moves relative to the reaction chamber 14 when the first and second slider units are actuated. Each of the slider units is substantially identical except for its orientation.

The first slider unit 140 includes a generally channel-shaped portion 150 and a rectangular portion 152 received in the channel of the channel-shaped portion. A pair of caged linear ball bearing assemblies 154 (the cages of which are visible in FIG. 4) run in grooves (not shown) formed in the opposing sides of the channel and the sides of the rectangular portion 152 which face the opposing sides. A bracket 156 fixedly attached by fasteners 158 to the rectangular portion 154 of the first slider unit 140 supports a spherical bearing and bushing assembly 160 threaded through the lower end of a downwardly projecting portion 162 of the bracket. The connector 68 is received through an opening at the free end of the bearing and bushing assembly 160 which permits universal pivoting motion between the connector 68 and the bracket 156.

A thrust plate 164 is fixedly connected to the left end (as seen from the vantage of FIG. 4) of the rectangular portion 152. Two guide rods 166 extending from the thrust plate 164 are slidably received in the channel-shaped portion 150. Coil springs (not shown) within the guide rods 166 bias the rectangular portion 152 to the right as shown in FIG. 4. A tongue 168 projecting to the right from the top of the thrust plate 164 has a longitudinal slot (not shown) through which a locating fastener 170 is received into the top of an end plate 172 of the channel-shaped portion 150. So long as the locating fastener 170 is not tightened, the tongue 168 moves with the thrust plate 164 relative to the end plate 172 of the channel-shaped portion 150. The rectangular and channel-shaped portions 150, 152, respectively, can be fixed in place relative to one another by tightening the locating fastener 170.

A micrometer 174 mounted on the end plate 172 of the channel-shaped portion 150 of the first slider unit 140 extends through the end plate and engages a hardened spherical bearing 176 embedded in the thrust plate 164 of the rectangular portion 152. The micrometer 174 is not connected to the bearing 176 or thrust plate 164. However, the coil springs within the guide rods bias the bearing against the micrometer, and the channel-shaped and rectangular portions 150, 152 are further interconnected by a leaf spring 178 which also biases the rectangular portion to the right (as seen in FIG. 4), keeping the hardened bearing 176 in constant engagement with the end of the micrometer 174.

The micrometer 174 is a conventional vernier micrometer having a screw 180 which may be rotated within a casing 182 by turning a knob 184 to extend or retract the screw with respect to the casing. Vernier graduations 186, 188 on the knob and casing, respectively, permit precise quantitative measurement of the screw 180 position relative to the casing 182. If the knob 184 of the micrometer 174 is turned clockwise (as viewed from the right in FIG. 4) the screw 180 extends from the casing 182, thereby pushing the thrust plate 164 (and hence the rectangular portion 152) to the left relative to the channel-shaped portion. The leaf spring 178 operates to move the rectangular portion 152 to the right when the micrometer 174 is turned counterclockwise to retract the screw 180 within the casing 182. Because the rectangular portion 152 of the first slider unit 140 is connected to the connector 68, the nozzle 60 pivots about a vertical axis passing through the center of the spherical journal 122 when the micrometer 174 is turned to precisely orient the nozzle in an horizontal plane.

The second slider unit 142 is of substantially the same construction as the first unit 140. However, the second unit 142 is oriented in a position which is turned 90° counterclockwise from the position of the first unit 140 in FIG. 4. The second unit 142 includes a generally channel-shaped portion 190 and a rectangular portion 192 received in the channel of the channel-shaped portion. A pair of caged linear ball bearings (not shown) slidably connect the rectangular portion 192 to the channel-shaped portion 190. The channel-shaped portion 150 of the first unit 140 is fixedly connected to the rectangular portion 192 of the second unit 142 for conjoint vertical movement of the first unit with the rectangular portion of the second unit. The connector 68, which is connected to the bracket 156 connected to the first unit 140, moves vertically with the rectangular portion 192 of the second unit 142. The channel-shaped portion 190 of the second unit 142 is fixedly attached to the base 144 which is attached to the table 146 (FIG. 1) surrounding the barrel reactor 10.

At the lower end of the rectangular portion 192 of the second unit 142, a thrust plate 202 is fixedly connected to the rectangular portion. Guide rods 204 extending upward from the thrust plate 202 are slidably received in the channel-shaped portion 190. Coil springs (not shown) within the guide rods 204 bias the rectangular portion 192 upward. A tongue 206 projecting upward from the left end (as seen from the vantage of FIG. 4) of the thrust plate 202 has a longitudinal slot 208 (FIG. 3) through which a locating fastener 210 is received into the left end of an end plate 212 fixed to the channel-shaped portion 190. So long as the locating fastener 210 is not tightened, the tongue 206 moves with the thrust plate 202 relative to the end plate of the channel-shaped portion 190. The rectangular and channel-shaped portions, 192, 190, respectively of the second unit 144 can be fixed in place relative to one another by tightening the locating fastener 210.

A second micrometer 214 mounted on the end plate 212 of the channel-shaped portion 190 of the second slider unit 142 extends through the end plate and engages a hardened spherical bearing 216 embedded in the thrust plate 202 of the rectangular portion 192. The micrometer 214 is not connected to the bearing 216 or thrust plate 204, but the coil springs within the guide rods bias the bearing against the micrometer. The channel-shaped and rectangular portions 190, 192, respectively are further interconnected by a leaf spring 218 which further biases the rectangular portion upward, keeping the hardened bearing 216 in constant engagement with the end of the micrometer 214.

The second micrometer, generally indicated at 214, is also a conventional vernier micrometer having a screw 220 which may be rotated within a casing 222 by turning a knob 224 to extend or retract the screw from the casing. Vernier graduations 226, 228 on the knob and casing, respectively, permit precise quantitative measurement of the screw 220 position relative to the casing 222. It is envisioned that other types of micrometers and/or actuators such as digital electronic micrometers may be substituted for the manual analog first and second micrometers 174, 214 of the preferred embodiment without departing from the scope of this invention.

If the knob 224 of the second micrometer 214 is turned clockwise (as viewed from the top) the screw 220 extends from the casing 222 and pushes the thrust plate 202 (and hence the rectangular portion 192) downward relative to the channel-shaped portion 190. The leaf spring 218 and coil springs within the guide rods 204 operate to move the rectangular portion 192 upward when the second micrometer 214 is turned to retract the screw 220 within the casing 222. Thus it may be seen that very precise pivoting of the nozzle 60 in a vertical plane is achieved by turning the second micrometer 214, because the first unit 140 and connector 68 are mounted for conjoint vertical movement with the rectangular portion 192 of the second unit 142.

Thus configured, the direction of the nozzles 60 (and therefore the direction in which the gas jets enter the reaction chamber 14) may be adjusted by turning each of the micrometer knobs 184, 224. The first micrometer 174 of each gas injection assembly 52 may be adjusted to horizontally move the corresponding rectangular portion 152 of the first unit 140 relative to the table 146 to pivot the connector 68 about the vertical axis and adjust the nozzle 60 in the horizontal plane. Similarly, the second micrometer 214 may be adjusted to vertically move the second unit 142 relative to the table 146 to pivot the connector 68 about the horizontal axis and adjust the nozzle 60 in the vertical plane. By combining movements of the first and second slider units 140, 142, the nozzle 60 may be aimed toward a target anywhere (within the range of motion of the nozzle and slider units) in a plane perpendicular to the centerline of the cavity 50. Both of these nozzle adjustments affect the intra-wafer and inter-wafer uniformity of the material thickness in a vertical direction along the susceptor 34. Because the micrometers include graduations 186, 188, 226, 228, the position is repeatable and precise control of the vertical thickness uniformity may be achieved.

Once aimed, the nozzles 60 are prepared to deliver reactant gas into the reaction chamber 14 of the barrel reactor. Reactant gas enters each nozzle housing assembly through the inlet port 100 and travels through the orifice 126 and into the internal passage 124. The nozzle 60 directs the gas into the reaction chamber 14 as a jet. The jets from each nozzle collide at point P (FIG. 2) ideally to eliminate the circumferential velocity components of the jets when the jet mass flow rates are equal. The gas thoroughly mixes before travelling generally downward between the susceptor 34 and the inside wall of the reaction chamber 14 over the exposed faces of the wafers W held in the susceptor.

To periodically calibrate the apparatus, a target grid similar to that used for the prior art method of alignment described in the Background of the Invention is installed in the reaction chamber 14 where the jets should ideally be directed. A tubular pointer (not shown) is also installed over the end of the nozzle as in the prior art method. The micrometers 174, 214 are adjusted until the pointer is aligned with the center of a target on the target grid and the positions of the respective graduations 186, 188, 226, 228 are read and recorded. Then micrometer 174 is adjusted to align the pointer with a second target point located a predetermined distance (e.g., 5 mm) to the right or left of the center target point and the graduation positions 186, 188 are again read and recorded. Similarly, micrometer 174 is adjusted back to the center target position and micrometer 214 is adjusted to align the pointer with a third target point located a predetermined distance directly above or below the center target point and the graduation positions 226, 228 are read and recorded. A correlation factor between the nozzle grid position and the micrometer readings may be calculated so that nozzle movement may be precisely correlated to micrometer extension and retraction. For example, if the first micrometer 174 is moved ten units when the pointer travels two target grid units, then the micrometer is moved five units for every grid unit of desired nozzle travel in the plane of the target. In this manner, the operator can use conventional grid units in a correlation formula to obtain micrometer settings.

Once the calibration is performed, re-calibration is not required until equipment changes, such as replacement of the reaction chamber 20, are made. Therefore, the operator can simply check the micrometer settings to verify jet location without opening the reactor 10 and installing the target grid and pointers. If thickness variations are noted, small changes in position may be made by adjusting the micrometers outside the reaction chamber. Due to the long connector length and fine adjustment available with the micrometers, very accurate and repeatable nozzle adjustments may be made. The apparatus eliminates the delicate nozzle alignment procedure described in the Background of the Invention and the attendant opportunity for operator error. Because the nozzle adjustment does not involve partially disassembling the jet assemblies, it may easily and quickly be performed at any time, causing less down time. In addition, because the pointer and target need only be infrequently installed and because the new procedure does not require disassembly of the jet assembly, it reduces the opportunity for the introduction of contaminates into the reaction chamber.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A jet assembly for delivering reactant gas from a supply thereof to a reaction chamber of a barrel reactor during a chemical vapor deposition process for depositing a material onto a semiconductor wafer contained within the reaction chamber, the jet assembly comprising:

a nozzle adapted for mounting on the barrel reactor in fluid communication with the supply of reactant gas for selectively delivering a jet of reactant gas from the reactant gas supply to the reaction chamber for performing the chemical vapor deposition process in the reaction chamber, the nozzle being pivotable relative to the barrel reactor for selectively altering the direction in which the reactant gas jet enters the reaction chamber; and a positioning device connected to the nozzle for pivoting the nozzle relative to the barrel reactor to alter the direction in which the reactant gas jet enters the reaction chamber, the positioning device being constructed to permit quantitative measurement of the position of the nozzle relative to the barrel reactor thereby permitting reproducible aiming of the nozzle for selecting the direction in which the reactant gas jet enters the reaction chamber.

2. A jet assembly as set forth in claim 1 wherein the positioning device is constructed to provide numerical values related to the position of the nozzle relative to the barrel reactor.

3. A jet assembly as set forth in claim 1 further comprising a connector connected to the nozzle and positioning device for pivoting the nozzle in response to movements of the positioning device.

4. A jet assembly as set forth in claim 3 wherein the positioning device comprises a multiple axis stage adapted to pivot the nozzle relative to the barrel reactor independently about first and second axes of rotation, the second axis being generally perpendicular to the first axis.

5. A jet assembly as set forth in claim 4 wherein the stage includes first and second slider units, the first unit being connected to the connector and the second unit being connected to the barrel reactor, the first unit permitting the connector to move relative to the barrel reactor in a first plane to pivot the nozzle about the second axis, the second unit permitting the connector to move relative to the barrel reactor in a second plane to pivot the nozzle about the first axis.

6. A jet assembly as set forth in claim 5 wherein the stage includes at least one micrometer for determining the position of the connector relative to barrel reactor for reproducibly ascertaining the direction in which the reactant gas jet enters the reaction chamber.

7. A jet assembly as set forth in claim 1 in combination with the barrel reactor.

8. A jet assembly for delivering reactant gas from a supply thereof to a reaction chamber of a barrel reactor during a chemical vapor deposition process for depositing a material onto a semiconductor wafer contained within the reaction chamber, the jet assembly comprising:

a nozzle adapted for mounting on the barrel reactor in fluid communication with the supply of reactant gas for selectively delivering a jet of reactant gas from the reactant gas supply to the reaction chamber for performing the chemical vapor deposition process in the reaction chamber, the nozzle being pivotable relative to the barrel reactor about first and second axes of rotation, the second axis being generally perpendicular to the first axis, for selectively altering the direction in which the reactant gas jet enters the reaction chamber;

a connector connected to the nozzle and extending outwardly away from the reaction chamber for pivoting the nozzle relative to the barrel reactor in response to movement of the connector; and a multi-axis stage disposed outside the reaction chamber when the nozzle is mounted on the barrel reactor, the stage including first and second slider units, the first unit being connected to the connector and the second unit being connected to the barrel reactor, the first unit permitting the connector to move relative to the barrel reactor in a first plane to pivot the nozzle about the second axis, the second unit permitting the connector to move relative to the barrel reactor in a second plane to pivot the nozzle about the first axis.

9. A jet assembly as set forth in claim 8 wherein the stage includes at least one micrometer for determining the position of the connector relative to barrel reactor for reproducibly ascertaining the direction in which the reactant gas jet enters the reaction chamber.

10. A jet assembly as set forth in claim 8 further comprising a tubular nozzle housing assembly adapted for mounting on the barrel reactor thereby to connect the nozzle to the barrel reactor, the housing assembly supporting the nozzle for pivotal movement relative to the nozzle housing assembly, the connector extending into an interior of the nozzle housing assembly in sealed relation therewith, the nozzle housing assembly being adapted to receive reactant gas from the reactant gas source and to direct the reactant gas to the nozzle.

11. A jet assembly as set forth in claim 10 wherein the connector comprises a stem joined integrally with the nozzle and extending outwardly away from the reaction chamber when the nozzle housing assembly is mounted on the barrel reactor, the stem having an internal passage in fluid communication with the nozzle and an orifice providing fluid communication between the internal passage and the nozzle housing assembly interior thereby permitting reactant gas in the nozzle housing assembly to pass through the orifice and internal passage and into the nozzle for delivery into the reaction chamber.

12. A jet assembly as set forth in claim 10 wherein the nozzle housing assembly includes a rigid tubular body and a bellows connected in sealing relation to the body for retaining reactant gas within the housing assembly, the bellows being movable with respect to the body without loss of the sealing relation between the two, the connector sealingly passing through the bellows and out of the housing assembly thereby to permit movement between the connector and the body of the housing assembly without loss of reactant gas between the connector and body.

13. A jet assembly as set forth in claim 12 wherein the housing assembly further comprises a spherical bearing mounted on the bellows for pivoting motion relative to the bellows, the spherical bearing including a bushing surface for slidingly and sealingly receiving the connector so that the connector may pivot conjointly with the spherical bearing relative to the bellows and move longitudinally relative to the spherical bearing and bellows.

14. A jet assembly as set forth in claim 8 in combination with the barrel reactor.

15. A method of optimally aiming a nozzle of a barrel reactor for depositing material on a semiconductor wafer contained within the reactor by a chemical vapor deposition process, the method comprising the steps of:
- aiming the nozzle toward a first target site within the barrel reactor;
- pivoting the nozzle a predetermined amount to direct the nozzle toward a second target site spaced from the first target site; and
- measuring the distance between the first and second target sites thereby to establish a calibration factor correlating nozzle movement to a distance between current and desired reactant gas delivery sites.

16. The method as set forth in claim 15 further comprising the steps of:
- running the barrel reactor through a deposition cycle with the nozzle aimed toward a first reactant gas delivery site;
- determining the distance between the first delivery site and a second reactant gas delivery site providing optimized material deposition;
- pivoting the nozzle an amount equal to the determined distance between the first and second reactant gas delivery sites multiplied by the calibration factor.

17. A jet assembly for delivering reactant gas from a supply thereof to a reaction chamber of a barrel reactor during a chemical vapor deposition process for depositing a material onto a semiconductor wafer contained within the reaction chamber, the jet assembly having a nozzle and further comprising:
- means for aiming the nozzle toward a first target site within the barrel reactor;
- means for pivoting the nozzle a predetermined amount to direct the nozzle toward a second target site spaced from the first target site; and
- means for measuring the distance between the first and second target sites thereby to establish a calibration factor correlating nozzle movement to a distance between current and desired reactant gas delivery sites.

* * * * *